United States Patent
Shirota

(10) Patent No.: US 7,259,992 B2
(45) Date of Patent: Aug. 21, 2007

(54) SEMICONDUCTOR MEMORY DEVICE WITH A MEMORY CELL ARRAY FORMED ON A SEMICONDUCTOR SUBSTRATE

(75) Inventor: Riichiro Shirota, Fujisawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 171 days.

(21) Appl. No.: 11/136,369

(22) Filed: May 25, 2005

(65) Prior Publication Data

US 2005/0265079 A1    Dec. 1, 2005

(30) Foreign Application Priority Data

May 27, 2004  (JP)  ............................. 2004-157893

(51) Int. Cl.
*G11C 16/06*  (2006.01)
(52) U.S. Cl. ............................. 365/185.21; 365/185.18
(58) Field of Classification Search ........... 365/185.03, 365/185.18, 185.27, 185.21, 203
See application file for complete search history.

(56) References Cited

U.S. PATENT DOCUMENTS 5,602,775 A * 2/1997 Vo ........................ 365/185.01
5,654,920 A * 8/1997 Watsuji et al. ......... 365/185.27
6,493,265 B2  12/2002 Satoh et al.
2002/0159315 A1 * 10/2002 Noguchi et al. ............. 365/200

FOREIGN PATENT DOCUMENTS

JP    2000-228092    8/2000
JP    2000-268585    9/2000

* cited by examiner

*Primary Examiner*—Richard T. Elms
*Assistant Examiner*—Douglas King
(74) *Attorney, Agent, or Firm*—Oblon, Spivak, McClelland, Maier & Neustadt, P.C.

(57) ABSTRACT

A memory cell array on a region of a substrate, the cell array having word lines, bit lines and memory cells at crossings between the word and bit lines, drain and source of each memory cell coupled to a bit line and source line, respectively; and a sense amplifier circuit reading data of selected memory cells. The device has a data read mode detecting whether cell current flows from a bit line to the source line in accordance with data of a memory cell under the condition the well region is set at a base potential; a selected word line is applied with a read voltage, which turns on or off the memory cell in accordance with data thereof; the source line is applied with a first voltage higher than the base potential; and the selected bit line is applied with a second voltage higher than the first voltage.

11 Claims, 16 Drawing Sheets

| Selected Word Line | WL0—WL7 | WL8—WL15 | WL16—WL23 | WL24—WL31 |
|---|---|---|---|---|
| Source Line Voltage | 0V | VSL1 (>0V) | VSL2 (>VSL1) | VSL3 (>VSL2) |

SEMICONDUCTOR MEMORY DEVICE WITH A MEMORY CELL ARRAY FORMED ON A SEMICONDUCTOR SUBSTRATE

CROSS-REFERENCE TO RELATED APPLICATION

This application is based on and claims the benefit of priority from the prior Japanese Patent Application No. 2004-157893, filed on May 27, 2004, the entire contents of which are incorporated herein by reference.

BACKGROUND OF THE INVENTION

1. Field of the Invention

This invention relates to a semiconductor memory device, and more especially to a data read method of an EEPROM, which has electrically rewritable and non-volatile memory cells arranged therein.

2. Description of Related Art

An EEPROM (Electrically Erasable and Programmable Read-Only-Memory) is usually formed of memory cells with such a transistor structure that a charge storage layer (usually, floating gate) and a control gate are stacked. This memory cell stores a threshold voltage state, which is defined by a charge storage state of the floating gate, as data in a non-volatile manner. For example, the memory cell stores binary data of a logic "0" data defined by a high threshold voltage state as a result of that electrons have been injected into the floating gate; or a logic "1" data defined by a low threshold voltage state as a result of that electrons in the floating gate have been released.

Finely chop the memory cell's threshold voltage, and it is possible to store multi-value data. For example, four-value data is stored as defined by two bits stored in one memory cell.

In various EEPROMs, there is known a NAND-type flash memory, which may be highly integrated because plural memory cells are so connected in series as to constitute a NAND cell unit. Both ends of the NAND cell unit are coupled to a bit line and a common source line via select gate transistors, respectively. Control gates in the NAND cell unit are coupled to different word lines from each other.

In the NAND-type flash memory, a set of memory cells arranged along a word line constitutes a page (or two pages). Data read or write of the NAND-type flash memory may be performed at substantially high rate because it is performed by a page.

In a read mode of the NAND-type flash memory, a read current, which is carried through a NAND-cell unit in accordance with data of a selected memory cell, is detected under the condition of: a read voltage is applied to a selected word line so that memory cells become on or off based on data thereof; a pass voltage to non-selected (i.e., unselected) word lines so that memory cells turn on without regard to data thereof; and select gate transistors are turned on.

As a sense amplifier for reading data, any method of current-detecting type and voltage-detecting type may be used. In case, for example, a voltage-detecting type sense amplifier is used, a bit line is precharged to a certain voltage, and then set in a floating state. Thereafter, the bit line is subjected to discharge via a NAND cell unit. The sense amplifier detects the bit line voltage, which is different due to data of a selected memory cell, thereby judging data. In the data read mode, the common source line of the memory cell array is usually set at ground potential.

In case of binary data storage scheme, a relationship between read current (i.e., cell current), Icell, of a selected memory cell and control gate voltage (i.e., selected word line voltage) in the read mode is shown in FIG. 17. The sense amplifier detects in principle a deference between cell current Icell(1) of data "1" and cell current Icell(0) of data "0" on the condition of a read voltage Vr application. To prevent erroneous reading, it is required to set a lower limit value of the cell current Icell(1) and an upper limit value of the cell current Icell(0), and deal with a range between the lower limit value and upper limit value as a "forbidden range" or "inhibited range" as shown in FIG. 17.

This means, in other words, that it is required of the threshold voltage Vt, which defines the memory cell's data, to be set to have a certain inhibited range, INHV, therein as shown in FIG. 18.

On the other hand, as the memory cell is more and more miniaturized in the NAND-type flash memory, it has become impossible to disregard the short-channel effect. FIG. 19 shows the relationships between read current and control voltage of two memory cells A and B, the former having a large short-channel effect; and the latter a small short-channel effect. As shown in FIG. 19, the larger the short-channel effect, the less the dependence of the read current on the control voltage.

Therefore, the relationships between the read current Icell and the threshold voltage for the memory cells "A" and "B" are shown in FIG. 20. The inhibited range INHV(B) of the threshold voltage of memory cell "B" with a large short-channel effect is wider than the inhibited range INHV(A) of the threshold voltage of memory cell "A" with a small short-channel effect. This fact means that data read margin is reduced as the memory cell is more miniaturized.

So far, it has been explained a conventional read condition that the common source line is set at ground potential. By contrast, it has already been provided such a method that the common source line is set at a certain potential except ground potential under a certain read condition. For example, for the purpose of four-value data judging with two read operations, a method of controlling the source line has been provided (see, for example, Unexamined Japanese Patent Application Publication No. 2000-228092).

For reading data of an EEPROM, which stores four-value data designated as "xy" defined by an upper bit "x" and a lower bit "y", it is usually performed three times read operations as follows: at a first timing, the upper bit "x" of the memory cells is detected; and at second and third timings, read operations will be done for judging the lower bit "y" for memory cells having the upper bits "x" of "0" and "1", respectively. By contrast to this, to judge the four-value data with two read operations, the source line voltage is controlled as follows: at a first timing, upper bit data read is performed; and at a second timing of lower bit data reading, a certain read voltage is applied to memory cells under such the condition of: with respect to memory cell(s), upper bit of which is "1" (i.e., a low threshold voltage state), the source line voltage is set at 0V, while with respect to memory cell(s), upper bit of which is "0" (i.e., a high threshold voltage state), the source line is applied with a positive voltage so as to apparently boost the threshold voltage. As s result, the lower bit data may be judged with one read operation without regard to the upper bit data.

In the NAND-type EEPROM, the bias condition of the NAND cell unit at the write-verify read time is different from that at the erase-verify read time, and this results in that read currents (i.e., judging current) are different from each other. Considering it, there has been provided such a proposal that a positive voltage is applied to the source line at the erase-verify time, thereby making the judging currents of both of the write-verify operation and the erase-verify operation constant (see, Unexamined Japanese Patent Application Publication No. 2000-268585).

SUMMARY OF THE INVENTION

According to an aspect of the present invention, there is provided a semiconductor memory device including:

a memory cell array formed on a well region of a semiconductor substrate, the memory cell array having word lines, bit lines crossing the word lines, and electrically rewritable and non-volatile memory cells disposed at the crossings between the word lines and bit lines, drain and source of each memory cell being coupled to a bit line and a source line, respectively; and a sense amplifier circuit connected to the bit lines for reading data of selected memory cells, wherein the device has such a data read mode as to detect whether cell current flows or not from a selected bit line to the source line in accordance with data of a selected memory cell under the condition of: the well region is set at a base potential; a selected word line is applied with a read voltage, which turns on or off the selected memory cell in accordance with data thereof; the source line is applied with a first positive voltage higher than the base potential; and the selected bit line is applied with a second positive voltage higher than the first positive voltage.

According to another aspect of the present invention, there is provided a semiconductor memory device including a memory cell array formed on a well region of a semiconductor substrate, each memory cell within the memory cell array storing one of two or more threshold voltage distributions as data in a non-volatile manner, wherein the device has such a data read mode as to detect whether cell current flows or not in a selected memory cell on condition that a reverse bias voltage is applied between source of the selected memory cell and the well region for lessening an inhibited range between the threshold voltage distributions.

DETAILED DESCRIPTION OF THE EMBODIMENTS

Illustrative embodiments of this invention will be explained with reference to the accompanying drawings below.

Figure 1:
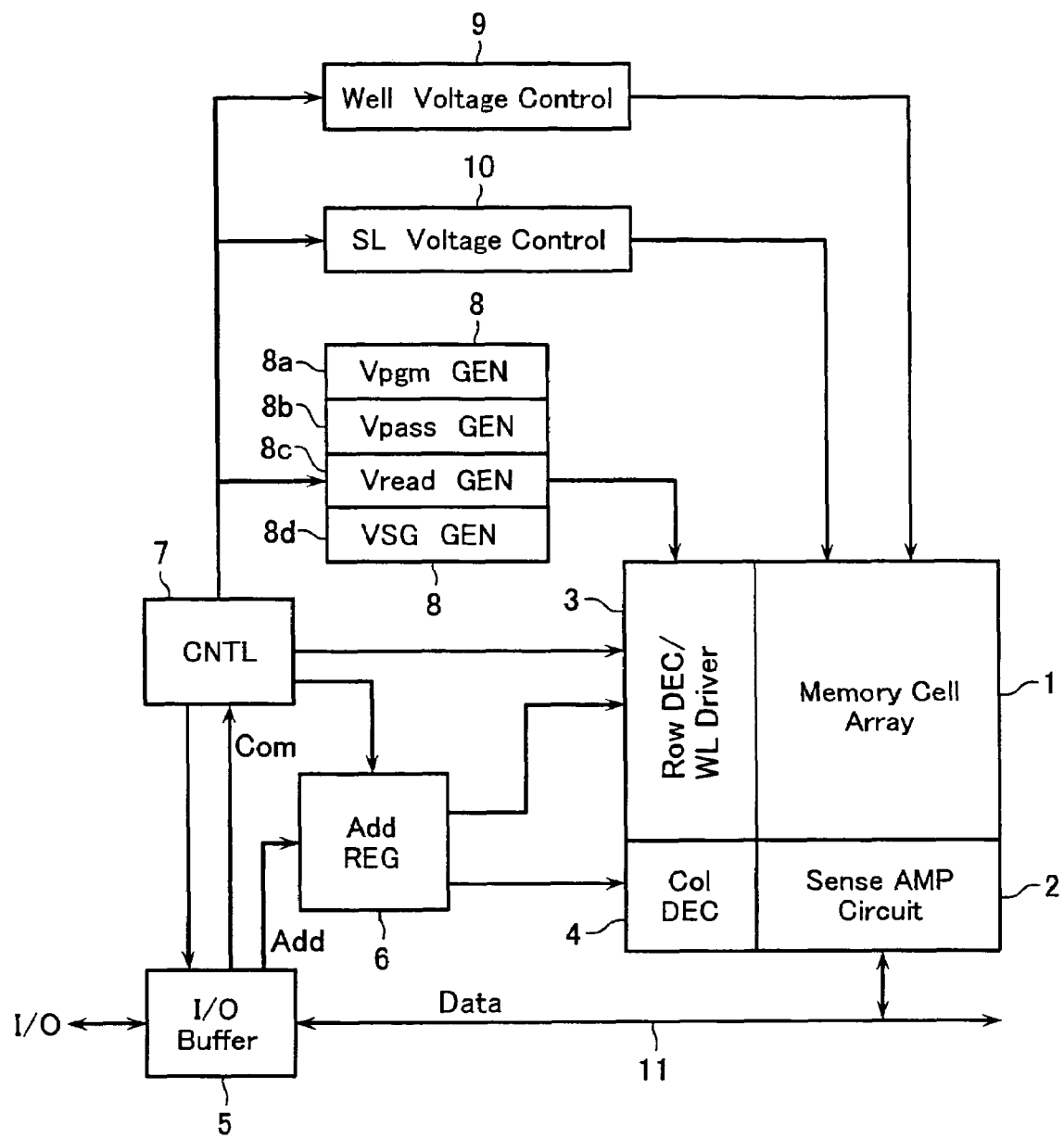
FIG. 1 shows a functional block configuration of a NAND-type flash memory in accordance with an embodiment of the present invention.
Figure 2:
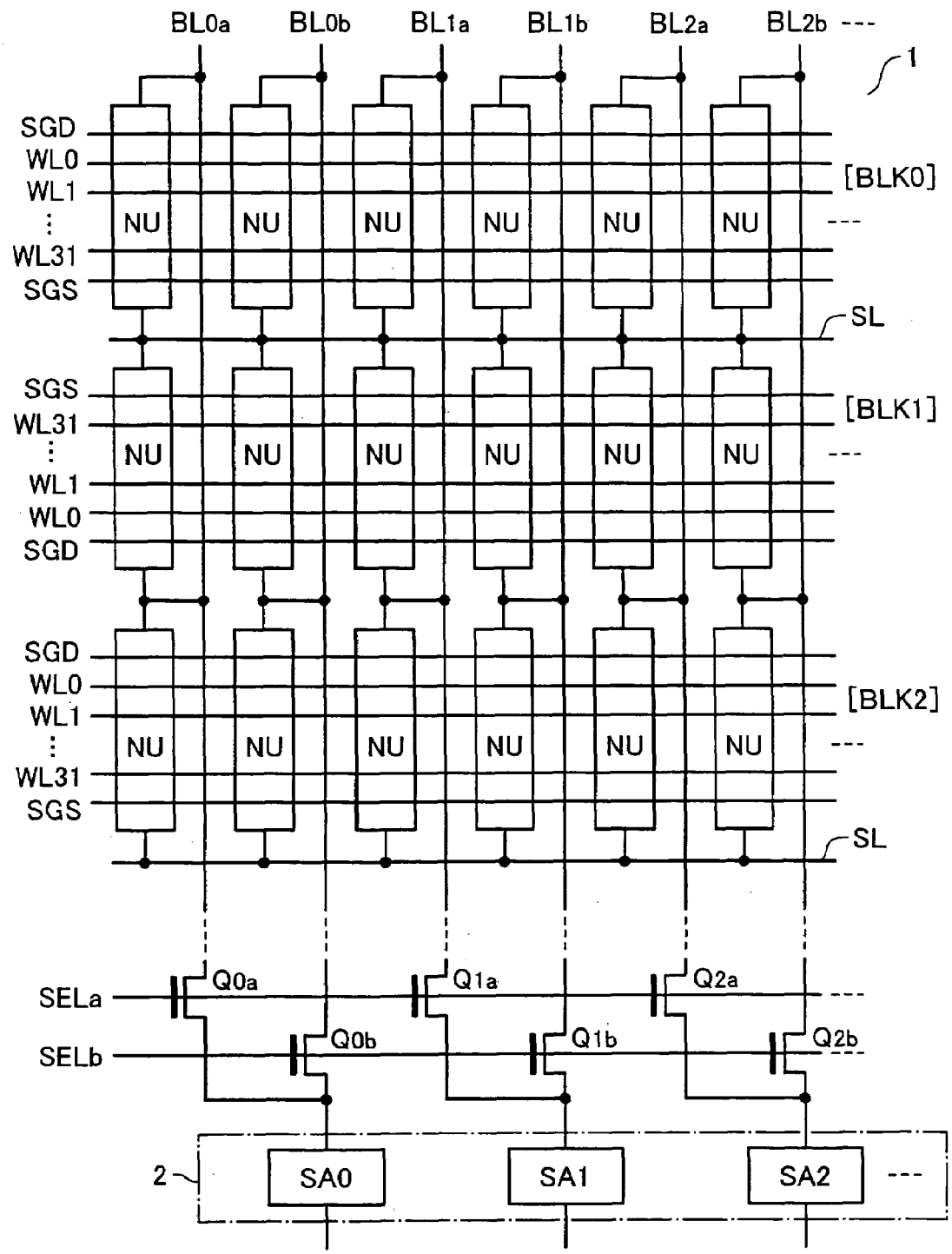
FIG. 2 shows an arrangement of a memory cell array in the flash memory.
Figure 3:
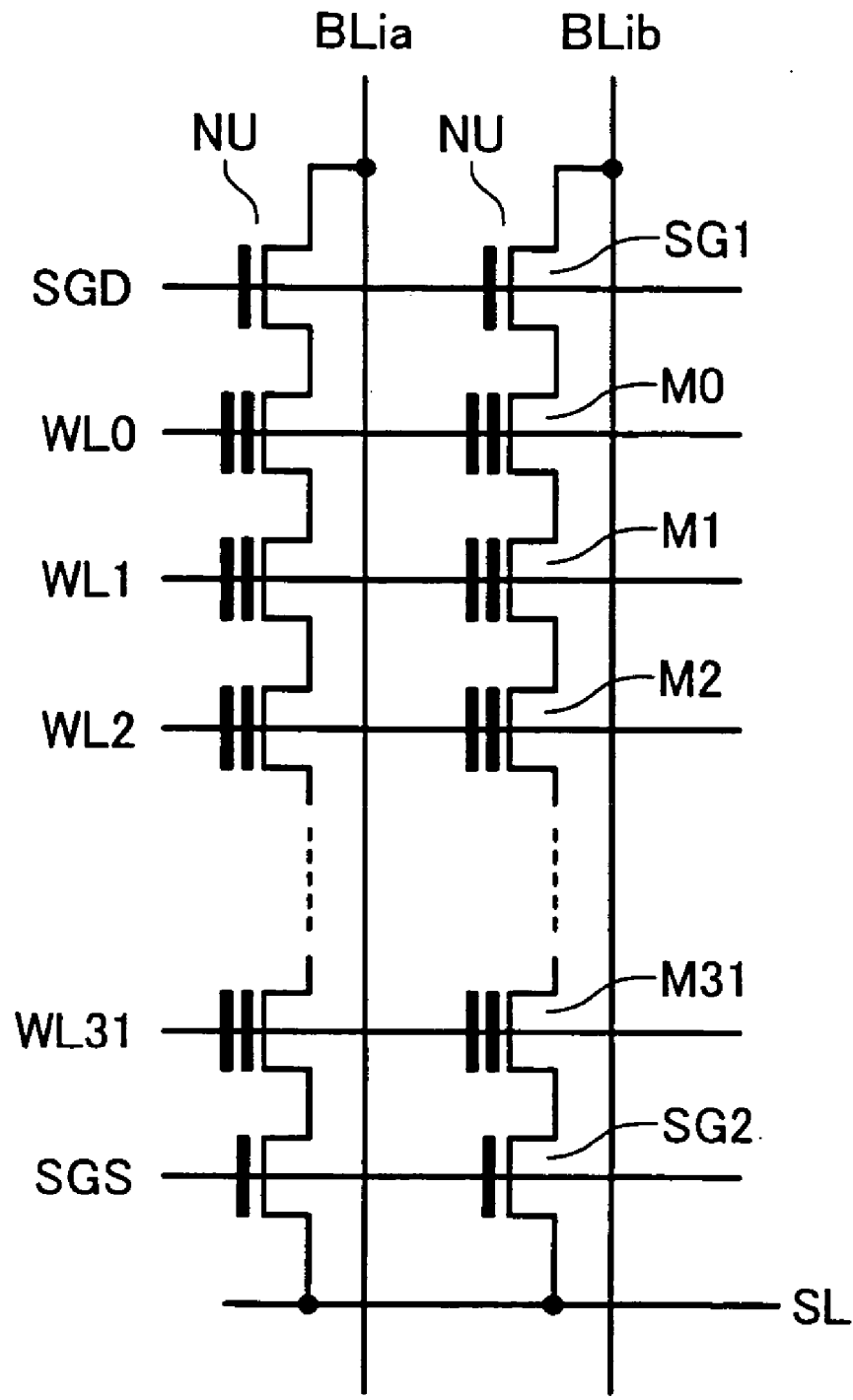
FIG. 3 shows a configuration of NAND cell units of the flash memory.

FIG. 1 shows a configuration of a NAND-type flash memory in accordance with an embodiment, and FIGS. 2 and 3 show an arrangement of memory cell array 1 therein. The cell array 1 is, as shown in FIG. 2, formed of memory cell units (i.e., NAND cell units) NU arranged in a matrix manner, each of which has plural memory cells connected in series. The NAND cell unit NU has, as shown in FIG. 3, electrically rewritable and non-volatile memory cells M0-M31, one end of which is coupled to bit lines BLia or BLib via a select gate transistor SG1; and the other end to a common source line SL in the cell array 1 via another select gate transistor SG2.

Control gates of the memory cells M0-M31 are coupled to word lines WL0-WL31, respectively. Gates of the select gate transistors SG1 and SG2 are coupled to select gate lines SGD and SGS, respectively, which run in parallel with the word lines.

As shown in FIG. 2, NAND cell units NU arranged in the row direction share the word lines WL0-WL31 and select gate lines SGD and SGS, which serve for connecting the NAND cell units to the bit lines BLia, BLib and source line SL.

A set of NAND cell units arranged in the direction of the word line is defined as a block, which serves as a data erase unit. A set of memory cells arranged along a word line constitute a page (or two pages, or four pages in a data storing scheme of two bits/cell), which serves as a data read unit or a data write unit. In the example shown in FIG. 2, plural blocks (BLK0, BLK1, . . . ) are arranged in the direction of the bit line.

The bit lines BLia and BLib (for example, i=0,1, . . . ,528) are arranged as crossing the word lines and shared by plural NAND cell units arranged in the column direction. The common source line SL is formed in such a way that plural NAND cell units arranged in the row direction share it.

Figure 4:
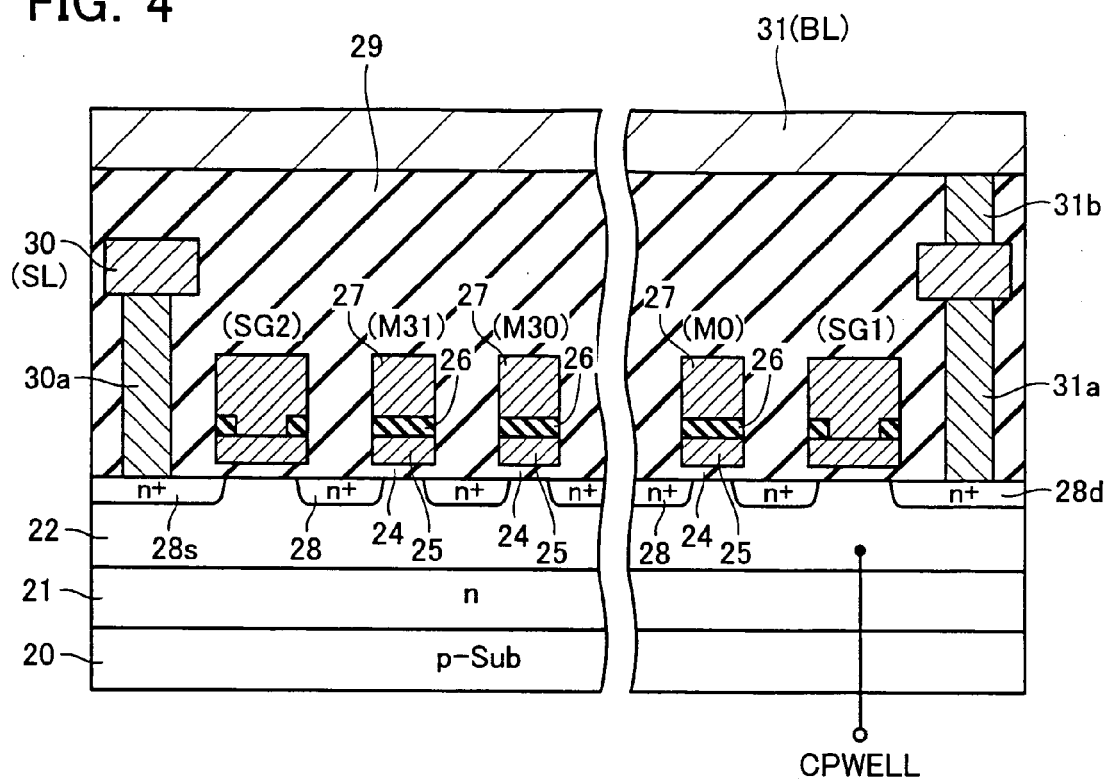
FIG. 4 shows a sectional view of the memory cell array taken along a bit line.
Figure 5:
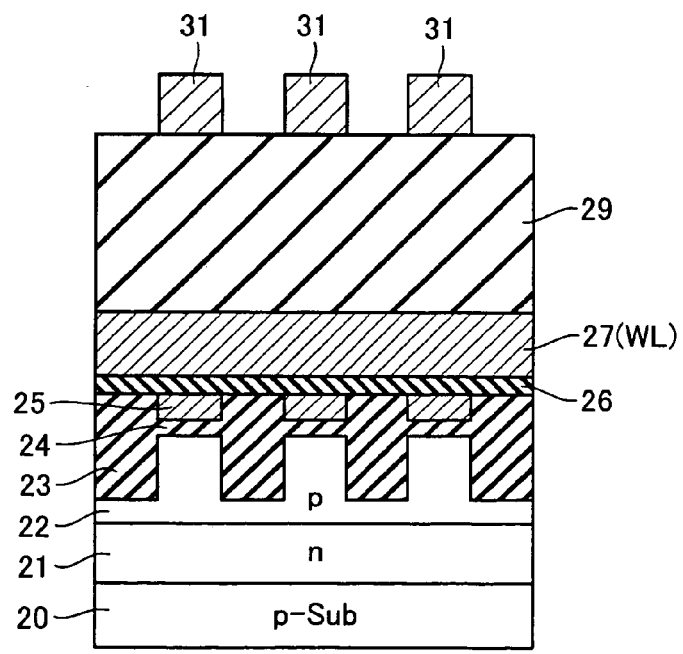
FIG. 5 shows a sectional view of the memory cell array taken along a word line.

FIGS. 4 and 5 show sectional views of the cell array 1 taken along bit line BL and word line WL directions, respectively. The memory cell array 1 is formed on a p-type well 22 in the p-type silicon substrate 20. The p-type well 22 is isolated from the substrate 20 by an n-type well 21. In the p-type well 22, stripe-shaped device formation regions are formed as being defined by a device insulating film 23. Floating gates 25 are formed above each device formation region with first gate insulating films (i.e., tunnel insulator films) interposed therebetween, and control gates 27 serving as word lines WL are formed above the floating gates 25 with second gate insulating films 26 interposed therebetween. Memory cells M0-M31 arranged in the sectional view of FIG. 5 are connected in series so as to share source/drain diffusion layers 28, and select gate transistors SG1 and SG2 are disposed at both ends thereof, thereby constituting a NAND cell unit.

In this embodiment, the memory cell has a stacked gate transistor structure with a gate length (i.e., channel length) of 100 nm or less (more preferably, 70 nm or less). In case of using such a miniaturized memory cell, in which the short channel effect becomes remarkable, this invention will become useful. One feature of the above-described cell array structure with the miniaturized memory cell is in that the floating gate 25 is thinner than the conventional case. Another feature is that the second gate insulating film 26 disposed between the floating gate 25 and the control gate 27 is formed of a highly dielectric material film (i.e., so-called Hi-k film), relative dielectric constant of which is larger than silicon nitride, and the control gate 27 is formed as substantially opposed to only the upper surface of the floating gate. For example, $Al_2O_3$ film may be used as one of the Hi-k films.

In the conventional cell array structure, the floating gate is formed with a sufficient thickness, and the control gate is formed as capacitive-coupled to not only the upper surface of the floating but also both side surfaces thereof. This is a result of consideration for making the capacitive coupling between the control gate and floating gate sufficiently large. By contrast to this, for the purpose of fabricating small memory cells with a high yield and securing a large capacitive coupling between the control gate and floating gate, the above-described noticeable structure is used in this embodiment.

The diffusion layer 28s on one end side of the NAND cell unit is connected to common source line (SL) 30 buried in the interlayer insulating film 29 via a contact plug 30a, while the diffusion layer 28d on the other side is connected to bit line (BL) 31 formed on the interlayer insulating film 29 via contact plugs 31a and 31b.

As shown in FIG. 1, a sense amplifier circuit 2 is disposed for sensing bit line data of the cell array and for serving as a data register for holding write data. This sense amplifier circuit 2 is coupled to a data input/output buffer 5 via a data bus 11. Connection between the sense amplifier circuit 2 and the data bus 11 is controlled by a column decoder 4, which decodes address data transferred through an address register 6. With these configurations, it becomes possible to write data supplied to data input/output ports I/O into the cell array 1, and read out data of the cell array 1 to the input/output ports I/O.

A row decoder 3, which includes word line drivers, is disposed for selecting and driving word lines WL and select gate lines SGD and SGS.

An internal voltage generating circuit 8 is arranged to generate various internal voltages, which are to be applied to memory cell array 1 and so on, at data read, write and erase times under the control of a controller 7. In detail, the internal voltage generating circuit 8 has: Vpgm generating circuit 8a for generating a write voltage, Vpgm, applied to a selected word line at a data write time; Vpass generating circuit 8b for generating a pass voltage, Vpass, applied to non-selected word lines at a data write time; Vread generating circuit 8c for generating a pass voltage, Vread, applied to non-selected word lines at a data read time; and VSG generating circuit 8d for generating a voltage, VSG, applied to select gate lines at a data write or read time; and the like. If Vpass or Vread is used to be applied to the select gate lines SGD and SGS, there is no need of disposing the VSG generating circuit 8d.

A well voltage control circuit 9 is disposed for controlling voltage of the substrate area (usually, p-type well), on which the memory cell array 1 is formed. In detail, the well voltage control circuit 9 is formed to generate ground potential, GND, as a base potential at data read or write time, and an erase voltage, Vera, higher than 10V at an erase time under the control of the controller 7. A source line voltage control circuit 10 controls the source line voltage under the control of the controller 7 in accordance with write, read and erase modes.

The controller 7 decodes command "Com" supplied from the input/output ports I/O and executes to control read, write and erase operations. In addition, the controller 7 distinguishes address "Add" and data "Data" supplied from the exterior, and controls these data transferring to the corresponding circuits.

As shown in FIG. 2, either of the even-numbered bit line BLia and odd-numbered bit line BLib in the cell array 1 is selected by bit line select transistors Qia and Qib to be coupled to a sense amplifiers SAi in the sense amplifier circuit 2. Since it is necessary to use transistors with a size larger than the memory cell in the sense amplifier circuit 2, two bit lines BLia and BLib share a sense amplifier SAi as described above. As a result, the occupied area of the sense amplifier circuit 2 has been reduced. It should be noted that it is possible to dispose sense amplifiers for the respective bit lines if permissible.

The entire sense amplifiers in the sense amplifier circuit 2 are activated simultaneously by an activation signal output from the controller 7 in this embodiment, and read or write is performed by a page of the memory cell array 1. By contrast, data is serially transferred between the sense amplifier circuit 2 and input/output terminals I/O by a byte (or by few or several bytes).

Figure 6:
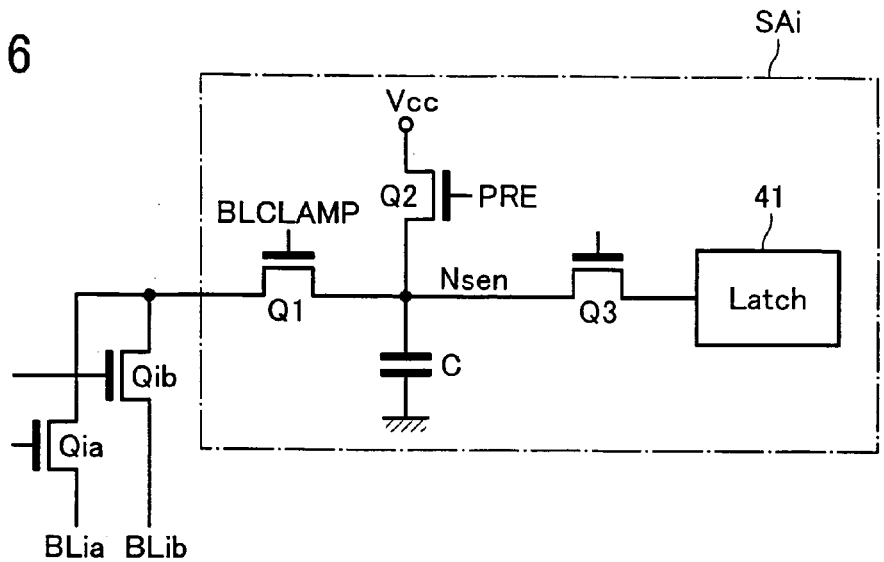
FIG. 6 shows a main portion of a sense amplifier of the flash memory.

The sense amplifier SAi is formed with a voltage detecting type or current detecting type. FIG. 6 shows a main portion of the sense amplifier SAi of a voltage detecting type. Disposed between a sense node Nsen and a bit line is a clamping NMOS transistor Q1, which serves for clamping the bit line voltage and serves as a pre-sense amplifier at a bit line voltage detecting time.

Further connected to the sense node Nsen is a precharging NMOS transistor Q2, which serves for precharging the sense node Nsen and bit line BL. The sense node Nsen is coupled to a data latch 41 via a transferring NMOS transistor Q3.

Figure 7:
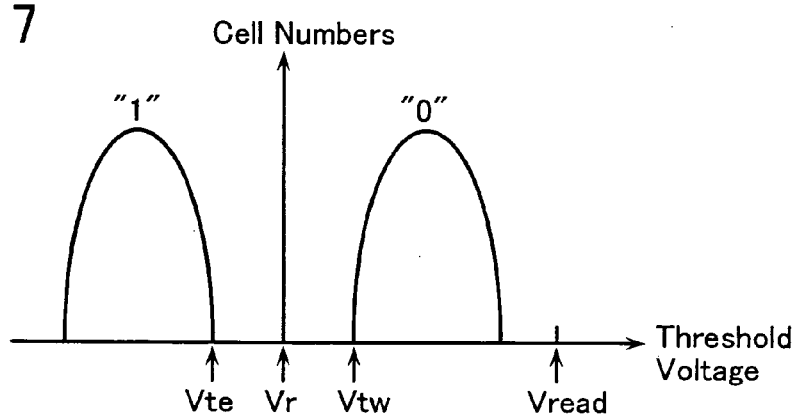
FIG. 7 shows binary data threshold distributions of the flash memory.

The memory cell stores a threshold voltage as a data defined by a charge storage state in the floating gate. For example, FIG. 7 shows data threshold voltage distributions in a case where the cell array 1 stores binary data in such a way that a negative threshold voltage state serves as a logic "1" data (i.e., erase state); and a positive threshold voltage state as a logic "0" data (i.e., write state).

Figure 8:
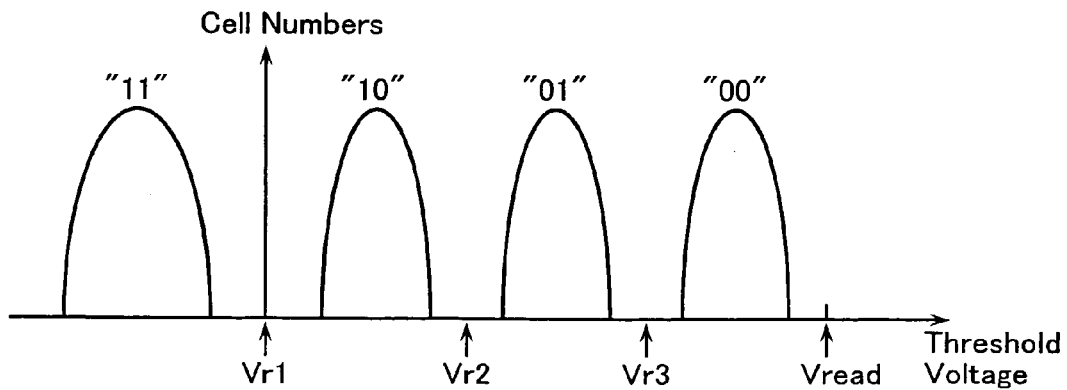
FIG. 8 shows four-value data threshold distributions of the flash memory.

The memory cell array 1 may be used for storing multi-value data in such a way that one memory cell stores two or more bits. For example, in case of four-value data storage scheme, one of data "11", "10", "01" and "00" is stored by use of the threshold voltage distributions as shown in FIG. 8. In the embodiments explained below, the binary data storage case will be mainly described.

Next, a data read operation in accordance with the embodiment will be explained. In this embodiment, it is used such a read operation condition that the read margin is not reduced under the condition of that the memory cell has a large short channel effect and a weak threshold voltage dependence as a result of miniaturization thereof.

Explaining in detail, to detect data with a read current (i.e., cell current) carried from the bit line to the common source line, while a node CPWELL of the p-type well, on which the cell array 1 is formed, is applied with a base potential (i.e., ground potential), a first positive voltage higher than the base potential is applied to the common source line, and a second positive voltage higher than the first positive voltage is applied to the bit line. In other words, data read is performed in a state where a reverse bias is applied between the n-type source diffusion layer, to which the source line SL is connected, and the p-type well.

Figure 9:
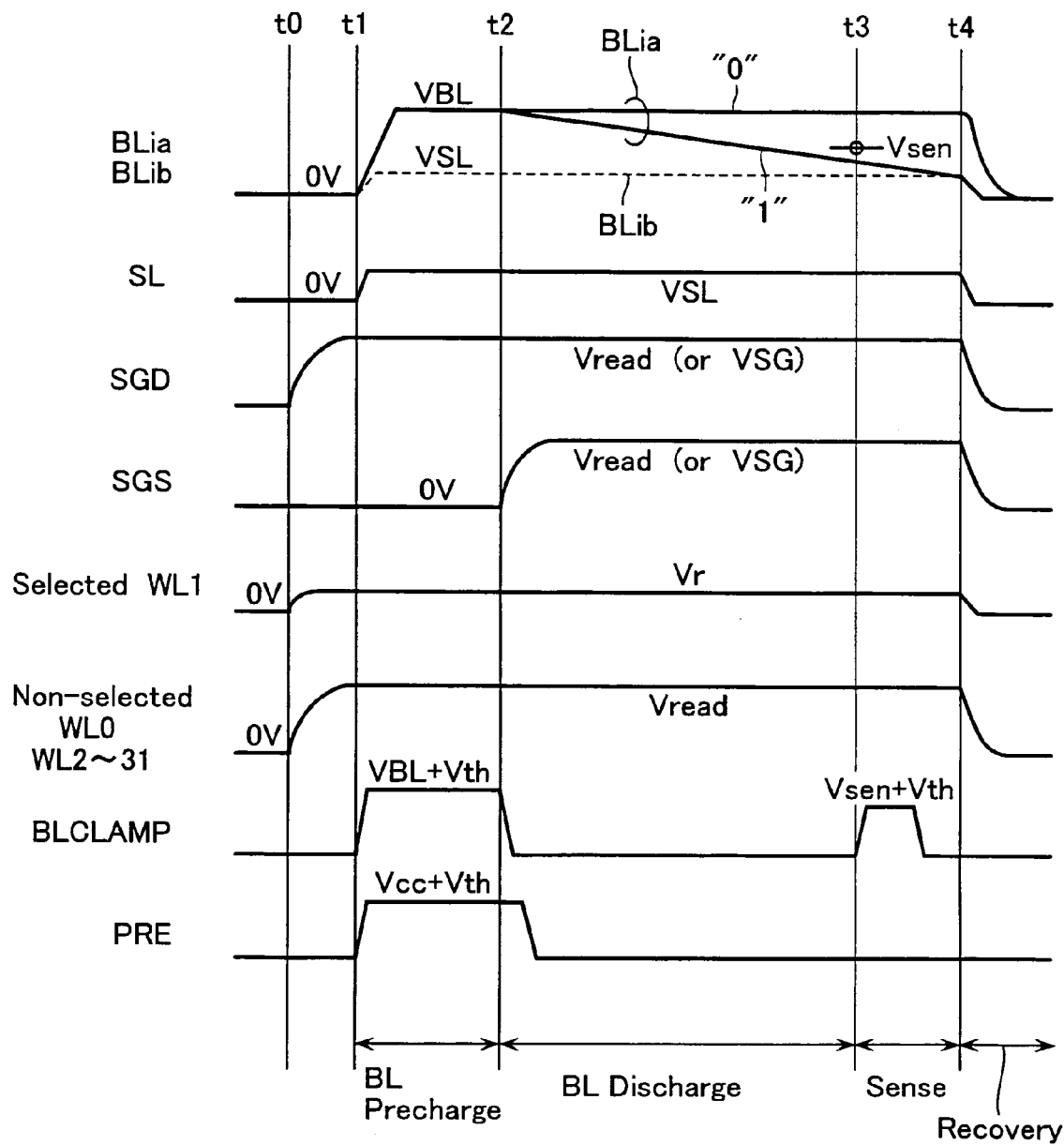
FIG. 9 is a timing chart for explaining a data read operation of the flash memory.

A data read operation will be described in detail below. A data read operation is performed by a page as described above. FIG. 9 shows a timing chart of the data read operation with giving attention to a selected block, in which the word line WL1 is selected. In non-selected blocks, the entire word lines and select gate lines are kept at 0V.

At timing t0, a read voltage Vr (e.g., 0V) is applied to the selected word line WL1; and a pass voltage Vread to non-selected (or unselected) word lines WL0 and WL2-WL31. The pass voltage Vread is selected as to be higher than the upper limit value of the threshold voltage distributions as shown in FIG. 7. In other words, the pass voltage is one necessary for turning on memory cells without regard to cells' data, and it is set, for example, in the range of 4V to 6V. The pass voltage Vread (or another control voltage VSG) is also applied to the select gate line SGD at the bit line side for turning on the select gate transistor.

At timing t1, the clamping transistor Q1 and precharging transistor Q2 are turned on in the sense amplifier SAi, thereby precharging the selected bit line BLia. Supposing that the voltage applied to the gate BLCLAMP of the clamping transistor Q1 is VBL+Vth (Vth: threshold voltage of NMOS transistor), the bit line is precharged at VBL (e.g., 0.4V to 1.2V). Simultaneously applied to the common source line SL at this time is a positive voltage VSL (e.g., 0.2V to 0.6V), which is lower than the bit line precharge voltage VBL.

The non-selected (or unselected) bit line BLib is applied with the same voltage VSL as the common source line SL. This prevents the non-selected bit line BLib from being in a state where unnecessary cell current is carried from the common source line SL to the non-selected bit line BLib, and the non-selected bit line BLib serves as a shield line for suppressing capacitive coupling noise between selected bit lines.

The bit line precharge operation is ended at timing t2, and then the select gate line SGS on the common source line side is applied with the pass voltage Vread. As a result, if the selected memory cell selected by the word line WL1 is in a data "1" state, a read current (i.e., cell current) flows through the NAND cell unit, thereby discharging the bit line BLia. If the selected memory cell is in a data "0" state, it is not turned on, therefore the bit line will not be discharged.

After having elapsed a certain period of the bit line precharge operation, bit line voltage is detected to judge data at timing t3. In detail, apply a sense voltage Vsen+Vth to the gate of the clamping transistor Q1 to turn on it, and a difference between the low voltage state of the bit line (i.e., data "1" state) and the high voltage state of the bit line (i.e., data "0" state) is amplified and transferred to the sense node Nsen. This sense result will be transferred to and held in the data latch 41.

Note here that it is permissible to reverse the rising timings of the select gate line SGD on the bit line side and the select gate line SGS on the source line side.

In case of four-value data storage scheme, it is required to perform three read operations with read voltages Vr1, Vr2 and Vr3 applied to a selected word line. Vr1, Vr2 and Vr3 are set between the respective data threshold voltage distributions as follows: for example, Vr1=0V, Vr2=0.8V to 1.4V and Vr3=1.8V to 2.2V. Supposing that the upper limit value of the threshold voltage distributions becomes higher than that in the binary data storage scheme, the pass voltage Vread to be applied to non-selected word lines will be set to be higher than that in the binary data storage scheme.

Figure 10:
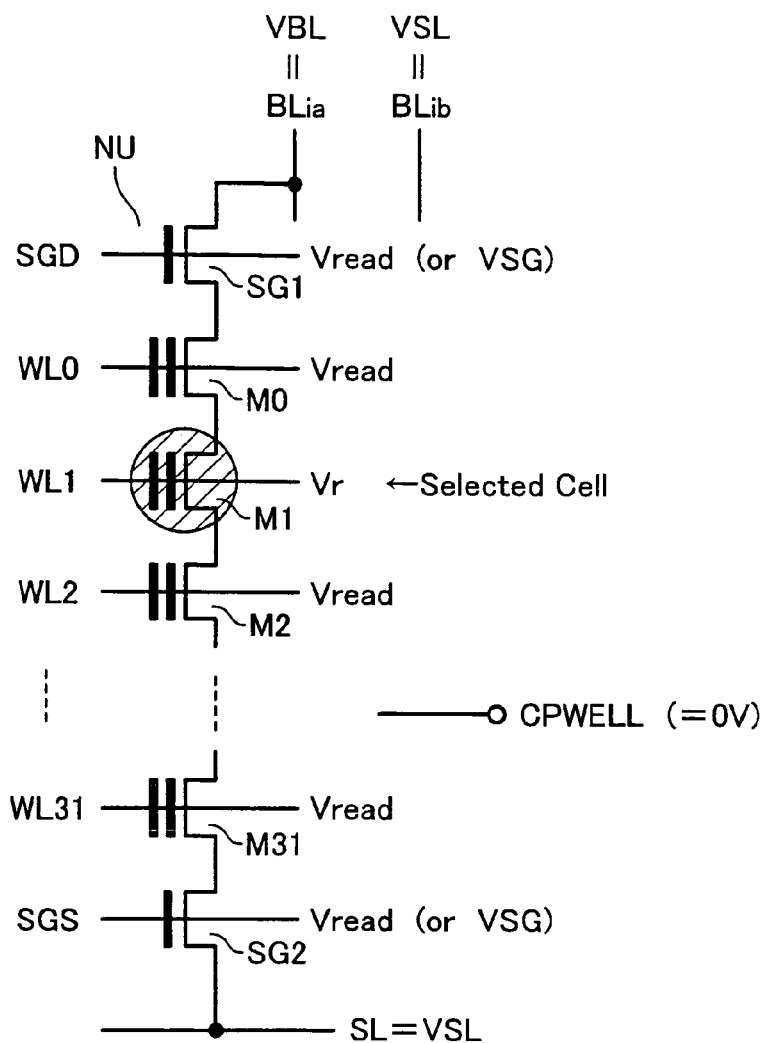
FIG. 10 shows a voltage relationship in a NAND cell unit at a data read time.

FIG. 10 shows a voltage relationship at the data read time with giving attention to a NAND cell unit connected to the selected bit line BLia. The common source line SL is usually set at a base potential (usually ground potential), but it is applied with the positive voltage VSL in this embodiment. Therefore, VBL-VSL is applied to the NAND cell unit at the beginning of the bit line discharge operation, and it is detected whether the read current (i.e., cell current) flows through the NAND cell unit or not, or whether the read current is large or not. The p-type well node CPWELL is set at ground potential, 0V, as well as the conventional case.

Figure 11:
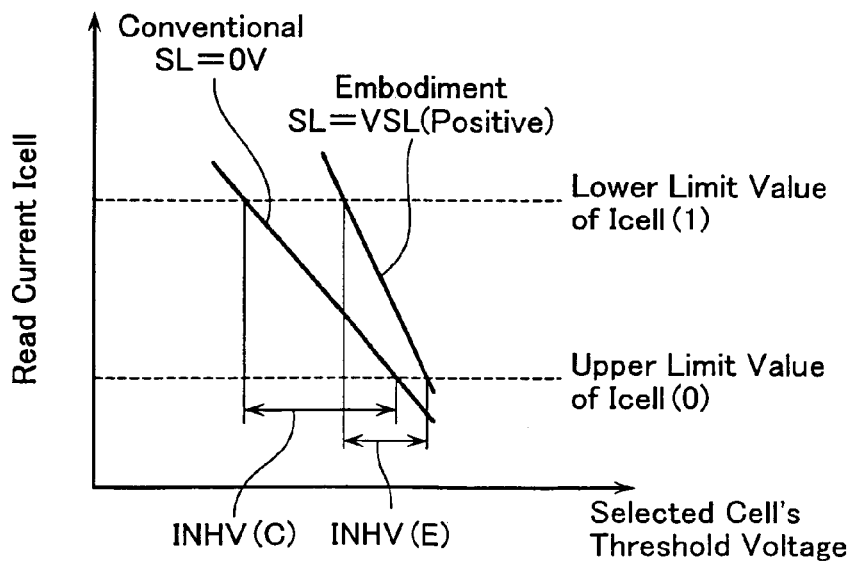
FIG. 11 shows a read current-threshold voltage characteristic of the flash memory in comparison with the conventional case.

FIG. 11 shows a relationship between the read current (i.e., cell current) Icell and the threshold voltage of the selected memory cell in this embodiment in comparison with that in the conventional case. As described above, the range between the upper limit value of "0" data read current Icell(0) and the lower limit value of "1" data read current Icell(1) is defined as an inhibited range. This also defines another inhibited range of the threshold voltage.

According to this embodying read method, in which the common source line SL is applied with a positive voltage, the substrate bias effect of the selected memory cell becomes larger, thereby suppressing the short channel effect. As a result, the read current Icell becomes to be strongly dependent on the threshold voltage. Therefore, as shown in FIG. 11, the inhibited range INHV(E) of the threshold voltage in this embodiment becomes narrower than the inhibited range INHV(C) in the conventional case.

According to this embodiment, in case the memory cell is so miniaturized that it becomes impossible to disregard the short-channel effect, it is possible to substantially lessen the inhibited range of the selected memory cell's threshold voltage, which is required of the memory to prevent erroneous data read. In other words, according to this embodiment, it may be secured a data read margin larger than that in the conventional case.

Figures 12, 13:
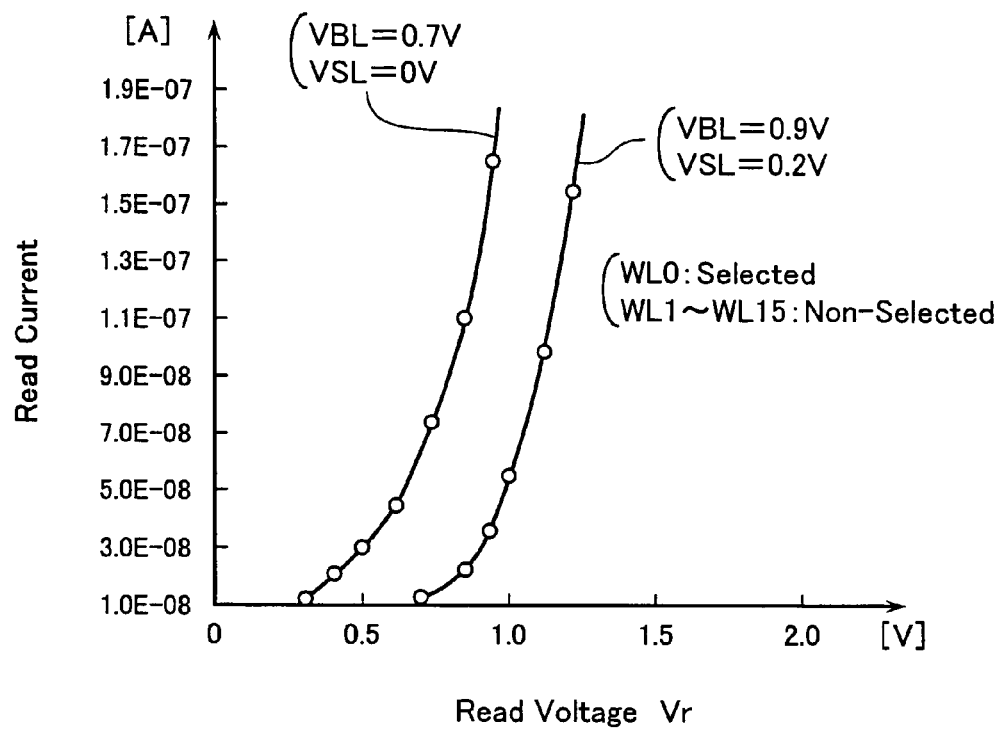
FIG. 12 shows a read current-threshold voltage characteristic of a tested flash memory.
FIG. 13 is a diagram for explaining an embodiment, in which source line voltage is exchanged in accordance with the selected word line position.

FIG. 12 is a measured result showing that read current (Icell) is dependent on source line voltage (VSL). This result has been measured with respect to a NAND-type flash memory having NAND cell units each formed of sixteen memory cells connected in series with a gate length of 130 nm. On the horizontal axis of FIG. 12, read voltage Vr is plotted. The selected word line is WL0, which is the nearest to the bit line. Non-selected word lines WL1-WL31 were applied with pass voltage, Vread=4.5V.

FIG. 12 shows two read current properties, one of which is under a normal condition that source line voltage is VSL=0V, and bit line voltage is VBL=0.7V; and the other is under such a condition that source line voltage is VSL=0.2V, and bit line voltage is VBL=0.9V in accordance with this embodiment.

It is supposed here that read data is judged by detecting whether read current of 4E-08[A] or more is carried or not. Further, to prevent erroneous data read, the lower limit value of the read current of on-cell (i.e., "1" data cell) is set at 8E-08[A], and the upper limit value of off-cell (i.e., "0" data cell) is set as 1E-08[A].

Under the above-described conditions, the result of FIG. 12 shows that in case the source line voltage is VSL=0V, read voltage Vr becomes 0.27V and 0.73V in correspondence with the upper limit and lower limit values of the read current, respectively, and difference thereof is ΔVr=0.46V. On the other hand, in case the source line voltage is VSL=0.2V, read voltage Vr becomes 0.67V and 1.03V in correspondence with the upper limit and lower limit values of the read current, respectively, and difference thereof is ΔVr=0.36V.

Supposing that threshold voltage of the memory cell is defined by a gate voltage (i.e., word line voltage) with which cell current starts to flow, the above-described read voltage difference ΔVr becomes the inhibited rage (non-sensitive range) between two data threshold voltage states as shown in FIG. 11. Therefore, it will be confirmed that with applying a positive voltage to the source line, the inhibited range of the threshold voltage becomes narrow, thereby improving the read data margin.

In case of the four-value data storage scheme, the inhibited ranges between the respective data threshold voltage distributions shown in FIG. 8 become narrow with applying a positive voltage to the source line as well as in the binary data storage scheme.

In a multi-value data storage scheme, as apparent from FIG. 8, for the purpose of avoiding too high voltages, it is required to narrow the voltage isolation widths between the data threshold voltage distributions in comparison with the binary data storage scheme. This embodiment is effective especially for the multi-value data storage scheme because the isolation width (inhibited range) of the data threshold voltages is narrowed, and it may be secured a sufficiently large read margin.

Further, according to this embodiment, with applying a positive voltage to the common source line, a threshold voltage of a memory cell state where floating gate thereof has no charge (i.e., neutral threshold voltage) becomes high.

The substrate bias effect of a selected memory cell is different in correspondence with the position of the selected memory cell in a NAND cell unit in such a manner as: the nearer to the bit line the selected memory cell is, the larger the substrate bias effect is. In consideration of this, it is useful to exchange voltage VSL applied to the common source line SL in correspondence with the selected memory cell position (i.e., selected page) in the NAND cell unit.

In the example shown in FIG. 13, thirty-two word lines are classified into four groups, and the voltage applied to the source line SL is exchanged in four steps in accordance with the selected word line position as follows: when a word line is selected in the group of word lines WL0-WL7 (i.e., when a selected memory cell is in memory cells M0-M7 disposed near the bit line), the source line SL is applied with 0V; when a word line is selected in the following word line group of WL8-WL15, the source line SL is applied with VSL1(>0V); in a similar way, source line voltages VSL2(>VSL1) and VSL3(>VSL2) are used for the word line groups of WL16-23 and WL24-31, respectively.

The above-described source line voltage exchange may be achieved, for example, in such a way that the source line voltage control circuit 10 is configured to receive input page address and output the source line voltages exchanged in accordance with the page address. When the source line voltage is exchanged, the bit line voltage VBL is also preferably exchanged for keeping the on-cell current substantially constant.

Exchange the source line voltage in accordance with the selected page as described above, position dependence of the read margin in the NAND cell unit may be reduced, and the read margin will be equalized. The above-described grouping of the word lines is only an example. It should be noted that other groupings of optional numbers of word lines may be used.

The read operation in accordance with the embodiment is effective for not only normal data read but also write-verify read. This point will be described below.

Data write is performed by the page. At the data write time, 0V and Vcc-Vth (Vth: threshold voltage of the select gate transistor) are transferred to NAND cell channels in accordance with write data "0" and "1" held in the sense amplifier circuit 2, respectively. The NAND cell channel with "1" data supplied becomes to be a floating state of Vcc-Vth.

When write voltage Vpgm is applied to a selected word line in the above-described state, electrons are injected into the floating gate of a selected cell to which "0" data is applied due to FN-tunneling, whereby "0" data is written into the cell. By contrast, electron injection will not be generated in another selected cell to which "1" data is applied, and "1" data state (i.e., erase state) thereof is kept as it is.

Figure 14:
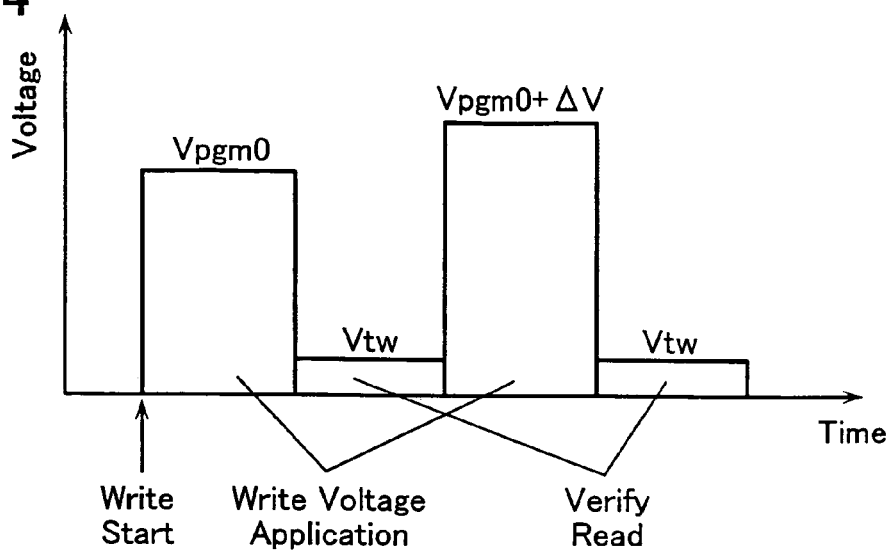
FIG. 14 is a diagram for explaining a data write operation of the flash memory.

In a practical data write sequence, as shown in FIG. 14, write voltage application and write-verify for verifying the write state will be repeatedly performed. The write voltage Vpgm applied to the selected word line is usually stepped-up at every write cycles.

Figure 15:
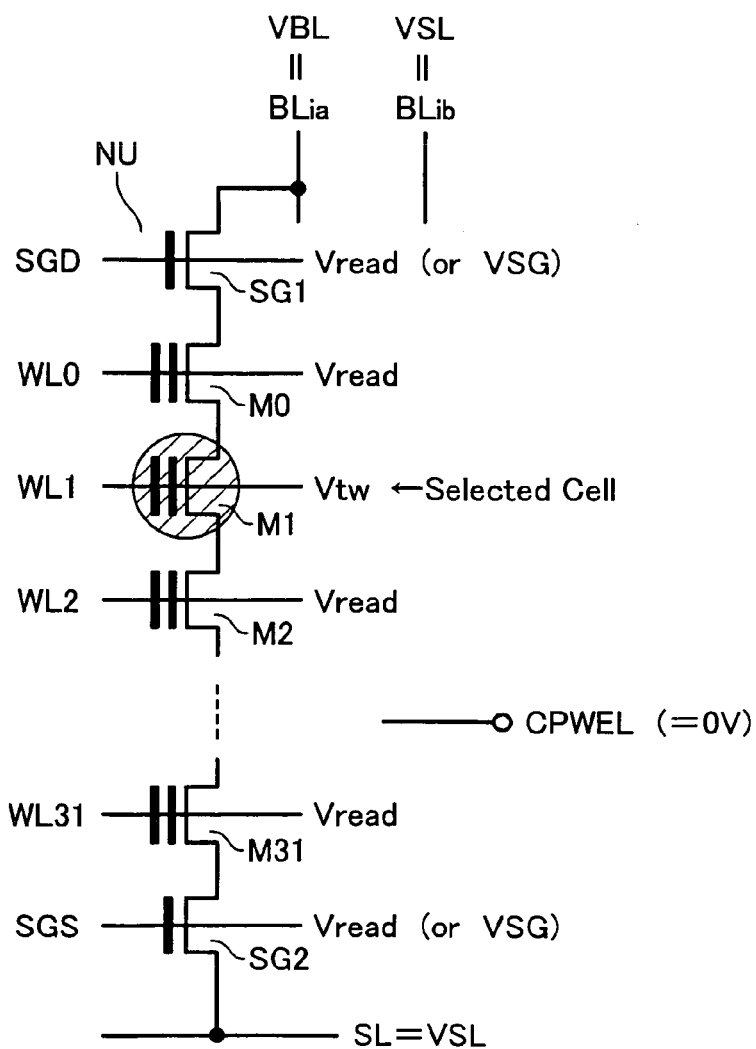
FIG. 15 shows a voltage relationship in a NAND cell unit at a verify-read time in a data write mode.

The verify-read operation is basically the same as the normal read operation. The voltages in the NAND cell unit at the verify-read time are shown in FIG. 15. As different from FIG. 10 showing the voltages at the normal read time, read voltage applied to the selected word line WL1 is set at the lower limit value Vtw of "0" data threshold distribution as shown in FIG. 7. With this voltage application, write-verify, which is to assure that "0" data threshold voltage is equal to Vtw or more, may be achieved. With applying the positive voltage VSL to the common source line SL like the normal read operation, it may be achieved an enlarged read margin.

In the write-verify, it is also effective to classify the word lines into some groups and let the common source line voltage VSL be exchanged in accordance with the selected memory cell position (i.e., selected word line position) in the NAND cell unit as shown in FIG. 13.

Figure 16:
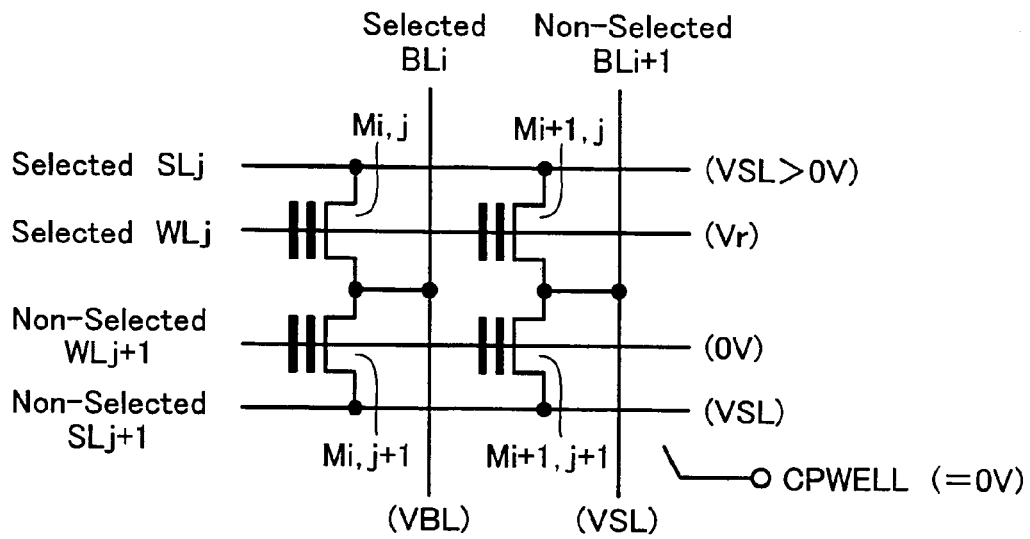
FIG. 16 shows a voltage relationship at a data read time of a NOR-type flash memory in accordance with another embodiment.
Figure 17:
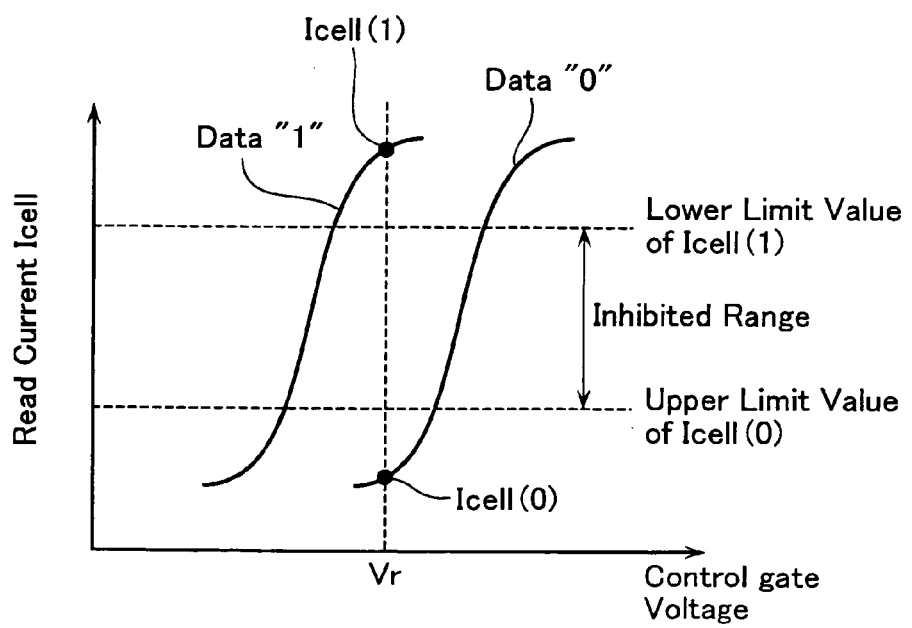
FIG. 17 shows a read current-control gate voltage characteristic of a binary data storing flash memory.
Figure 18:
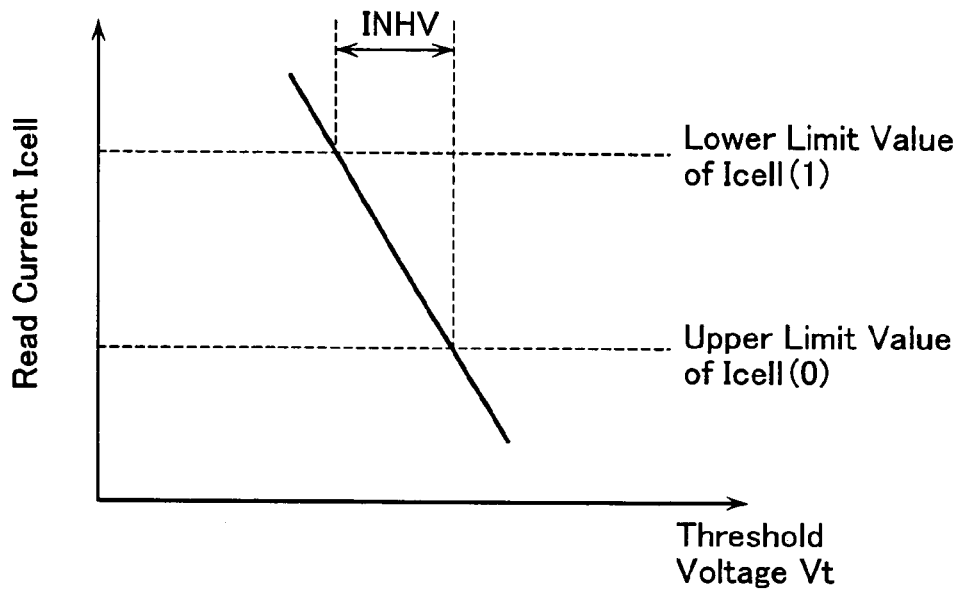
FIG. 18 shows a read current-threshold voltage characteristic of the flash memory.
Figure 19:
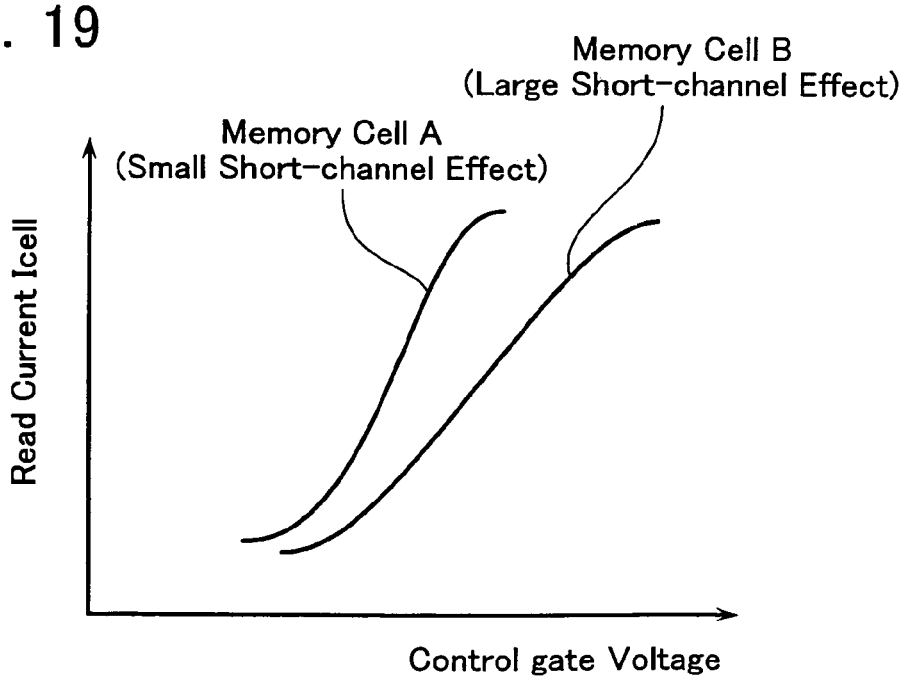
FIG. 19 shows a read current property charge due to short-channel effect of a flash memory.
Figure 20:
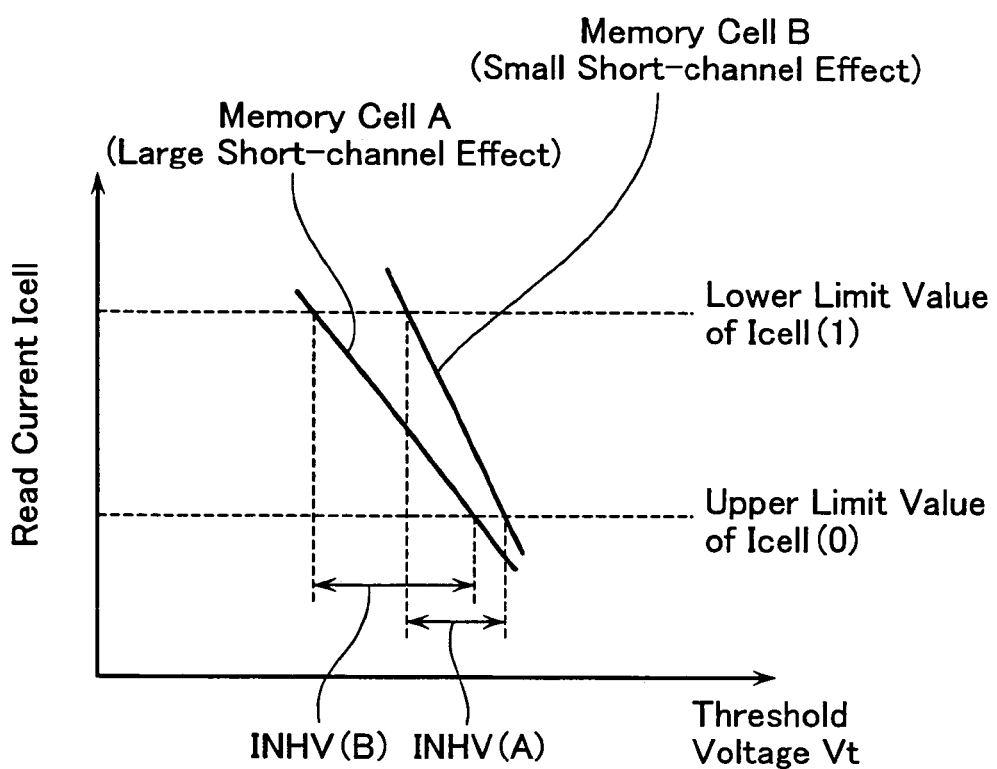
FIG. 20 shows a change of a read current-threshold voltage characteristic of a flash memory.

So far, there have been explained embodiments of the NAND-type flash memory. The present invention may be adapted to a NOR-type flash memory. FIG. 16 shows a voltage relationship at a read time in a memory cell array of a NOR-type flash memory.

In this case, a selected memory cell's ON or OFF is detected and cell data is judged under the condition of: the node CPWELL of the p-type well, on which the memory cell array is formed, is set at base potential i.e., 0V; a selected word line WLj is applied with a read voltage Vr; a selected source line SLj with a positive voltage VSL; a selected bit line with a positive voltage VBL higher than VSL; a non-selected word line WLj+1 with 0V; a non-selected source line SLj+1 and a non-selected bit line BLi+1 with VSL.

As a result, as similar to the NAND-type flash memory, the inhibited range between memory cell data threshold distributions may be lessened, thereby securing a large read margin. The present invention may be adapted to other types of flash memory such as AND-type, DINOR-type and the like.

Although, in the embodiment described above, ground potential (0V) is used as the base potential applied to the p-type well, it is allowable to use a negative potential as the base potential applied to the p-type well, and in this case 0V may be applied to the common source line. In this case, a negative voltage generation circuit is prepared for applying a negative voltage to the cell array.

Figure 21:
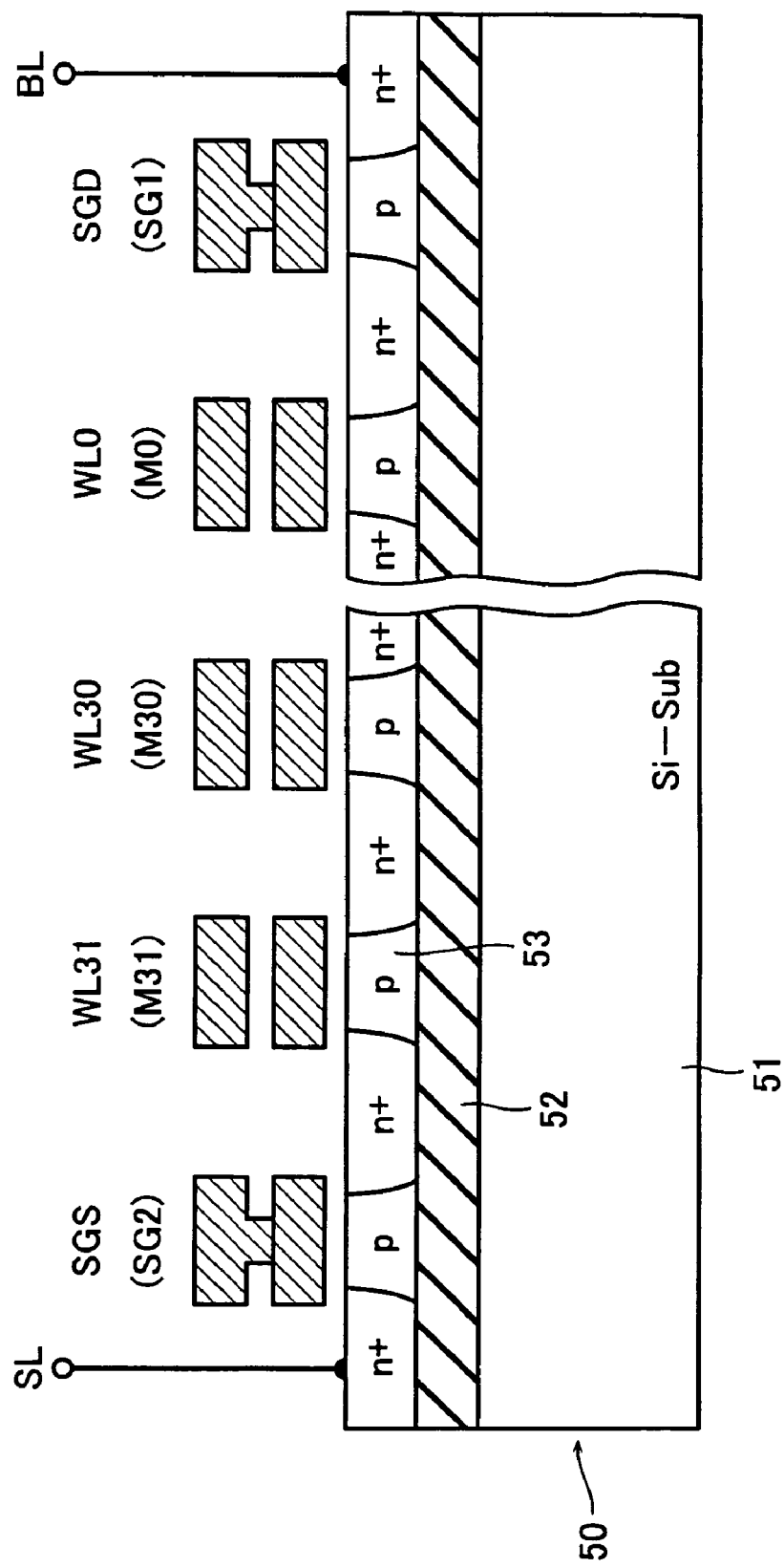
FIG. 21 is a sectional view of a memory cell array of a flash memory in accordance with another embodiment.

This invention may be adapted to a flash memory, in which a cell array is formed on an SOI (Silicon On Insulator) substrate. FIG. 21 is a sectional view of such a memory cell array of a NAND-type flash memory device.

Device base 50 has a silicon substrate 51 and a p-type silicon layer 53 formed thereon as being separated from the substrate 51 with an insulator film 52 such as a silicon oxide film interposed therebetween. NAND cell unit is formed on the silicon layer 53 with memory cells M0-M31 connected in series and select gate transistors SG1 and SG2 for coupling both ends thereof to a bit line BL and a source line SL, respectively. As similar to the embodiment shown in FIG. 4, control gates of the memory cells M0-M31 serve as word lines WL0-WL31, respectively, and gates of the select gate transistors SG1 and SG2 serve as select gate lines SGD and SGS, respectively.

In the flash memory with the above-described cell array structure, data read may be performed with the same bias relationship as the embodiment described above. That is, a selected word line is applied with a read voltage; non-selected word lines is applied with a read pass voltage; source line SL is applied with a first positive voltage; and bit line BL is applied with a second positive voltage higher than the first positive voltage. Detect cell current (read current) flowing through a NAND cell unit by a sense amplifier under the above-described bias condition, and data may be read out.

As an embodiment, an electric card using the non-volatile semiconductor memory devices according to the above-described embodiments of the present invention and an electric device using the card will be described bellow.

Figure 22:
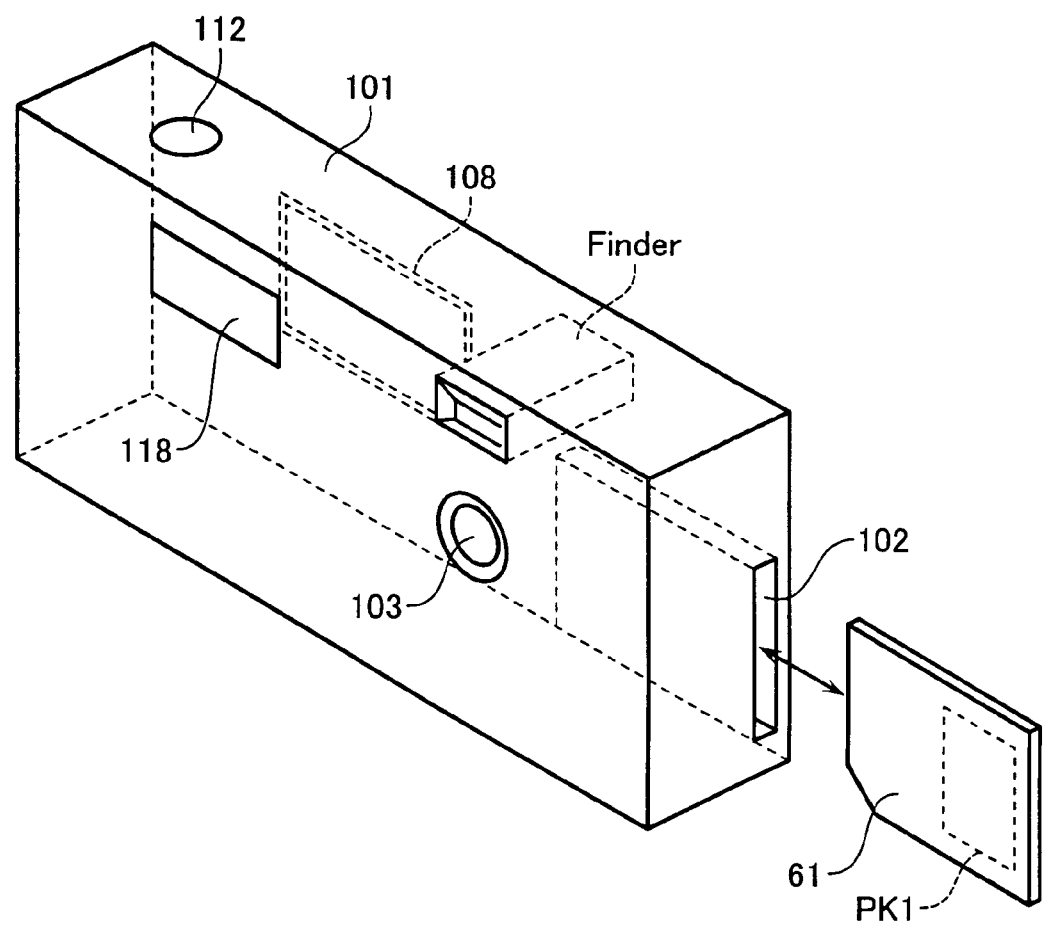
FIG. 22 shows another embodiment applied to a digital still camera.

FIG. 22 shows an electric card according to this embodiment and an arrangement of an electric device using this card. This electric device is a digital still camera 101 as an example of portable electric devices. The electric card is a memory card 61 used as a recording medium of the digital still camera 101. The memory card 61 incorporates an IC package PK1 in which the non-volatile semiconductor memory device or the memory system according to the above-described embodiments is integrated or encapsulated.

The case of the digital still camera 101 accommodates a card slot 102 and a circuit board (not shown) connected to this card slot 102. The memory card 61 is detachably inserted in the card slot 102 of the digital still camera 101. When inserted in the slot 102, the memory card 61 is electrically connected to electric circuits of the circuit board.

If this electric card is a non-contact type IC card, it is electrically connected to the electric circuits on the circuit board by radio signals when inserted in or approached to the card slot 102.

Figure 23:
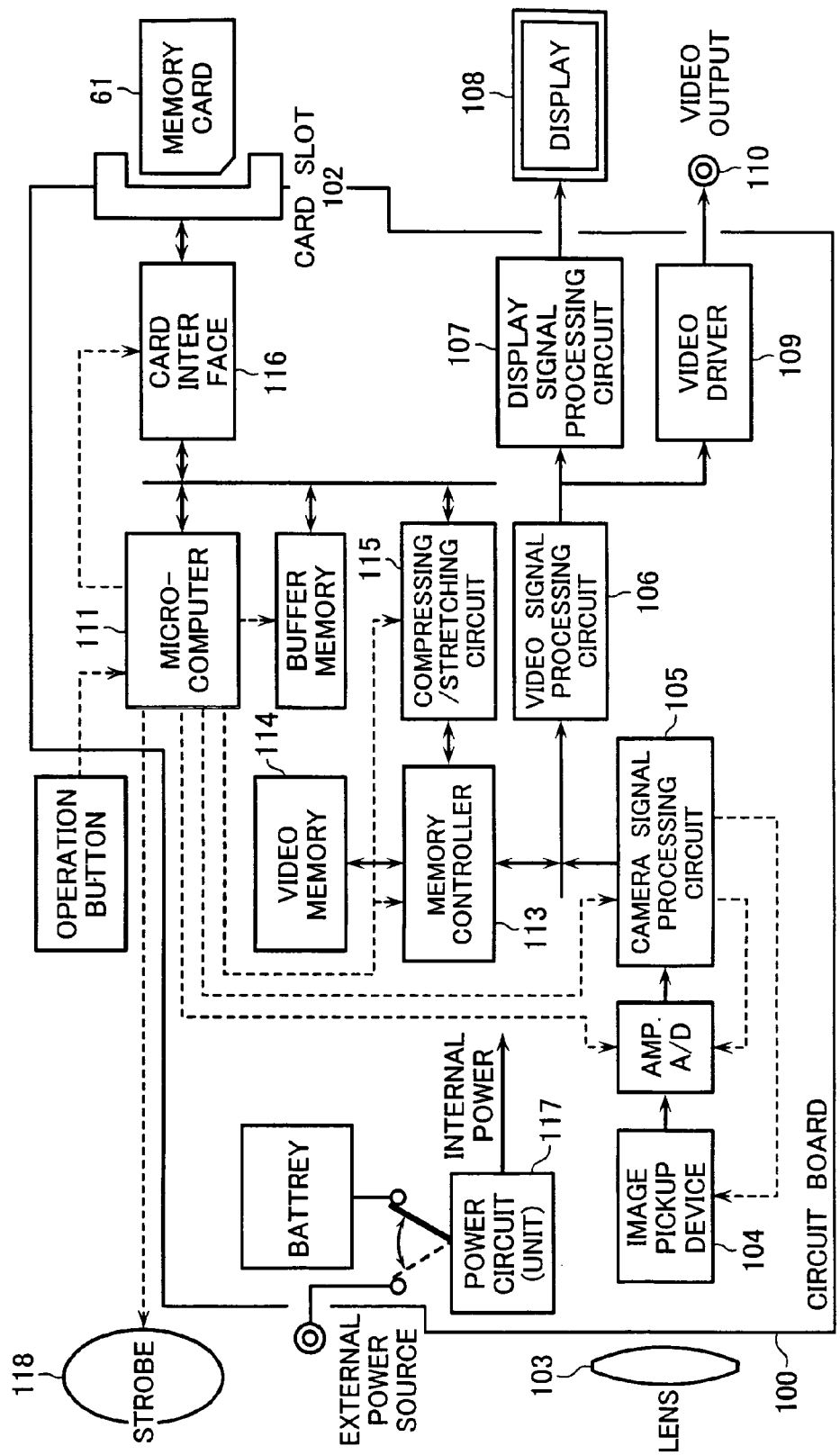
FIG. 23 shows the internal configuration of the digital still camera.
Figure 24A:
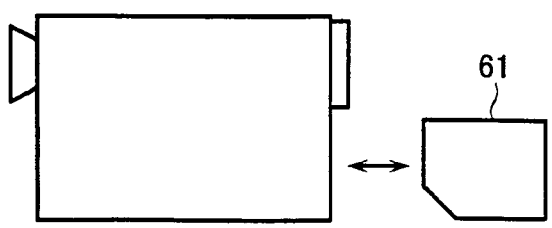
FIGS. 24A to 24J show other electric devices to which the embodiment is applied.
Figure 24F:
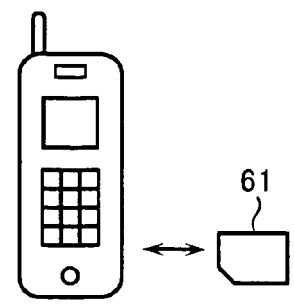
Figure 24B:
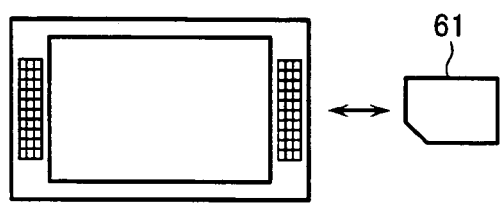
Figure 24G:
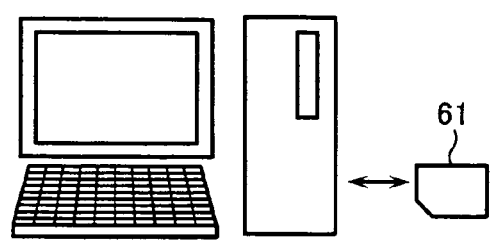
Figure 24C:
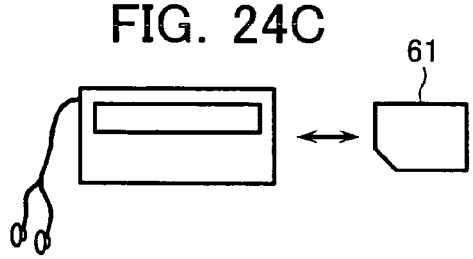
Figure 24H:
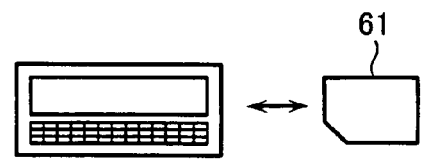
Figure 24D:
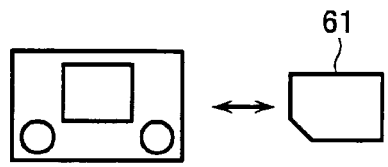
Figure 24I:
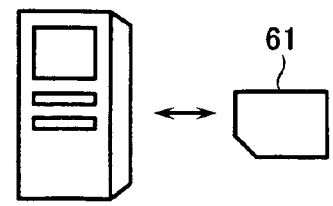
Figure 24E:
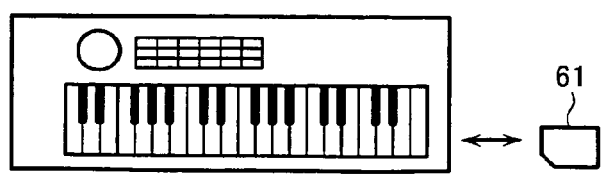
Figure 24J:
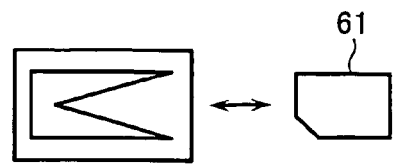

FIG. 23 shows a basic arrangement of the digital still camera. Light from an object is converged by a lens 103 and input to an image pickup device 104. The image pickup device 104 is, for example, a CMOS sensor and photoelectrically converts the input light to output, for example, an analog signal. This analog signal is amplified by an analog amplifier (AMP), and converted into a digital signal by an A/D converter (A/D). The converted signal is input to a camera signal processing circuit 105 where the signal is subjected to automatic exposure control (AE), automatic white balance control (AWB), color separation, and the like, and converted into a luminance signal and color difference signals.

To monitor the image, the output signal from the camera processing circuit 105 is input to a video signal processing circuit 106 and converted into a video signal. The system of the video signal is, e.g., NTSC (National Television System Committee). The video signal is input to a display 108 attached to the digital still camera 101 via a display signal processing circuit 107. The display 108 is, e.g., a liquid crystal monitor.

The video signal is supplied to a video output terminal 110 via a video driver 109. An image picked up by the digital still camera 101 can be output to an image apparatus such as a television set via the video output terminal 110. This allows the pickup image to be displayed on an image apparatus other than the display 108. A microcomputer 111 controls the image pickup device 104, analog amplifier (AMP), A/D converter (A/D), and camera signal processing circuit 105.

To capture an image, an operator presses an operation button such as a shutter button 112. In response to this, the microcomputer 111 controls a memory controller 113 to write the output signal from the camera signal processing circuit 105 into a video memory 114 as a flame image. The flame image written in the video memory 114 is compressed on the basis of a predetermined compression format by a compressing/stretching circuit 115. The compressed image is recorded, via a card interface 116, on the memory card 61 inserted in the card slot.

To reproduce a recorded image, an image recorded on the memory card 61 is read out via the card interface 116, stretched by the compressing/stretching circuit 115, and written into the video memory 114. The written image is input to the video signal processing circuit 106 and displayed on the display 108 or another image apparatus in the same manner as when image is monitored.

In this arrangement, mounted on the circuit board 100 are the card slot 102, image pickup device 104, analog amplifier (AMP), A/D converter (A/D), camera signal processing circuit 105, video signal processing circuit 106, display signal processing circuit 107, video driver 109, microcomputer 111, memory controller 113, video memory 114, compressing/stretching circuit 115, and card interface 116.

The card slot 102 need not be mounted on the circuit board 100, and can also be connected to the circuit board 100 by a connector cable or the like.

A power circuit 117 is also mounted on the circuit board 100. The power circuit 117 receives power from an external power source or battery and generates an internal power source voltage used inside the digital still camera 101. For example, a DC-DC converter can be used as the power circuit 117. The internal power source voltage is supplied to the respective circuits described above, and to a strobe 118 and the display 108.

As described above, the electric card according to this embodiment can be used in portable electric devices such as the digital still camera explained above. However, the electric card can also be used in various apparatus such as shown in FIGS. 24A to 24J, as well as in portable electric devices. That is, the electric card can also be used in a video camera shown in FIG. 24A, a television set shown in FIG. 24B, an audio apparatus shown in FIG. 24C, a game apparatus shown in FIG. 24D, an electric musical instrument shown in FIG. 24E, a cell phone shown in FIG. 24F, a personal computer shown in FIG. 24G, a personal digital assistant (PDA) shown in FIG. 24H, a voice recorder shown in FIG. 24I, and a PC card shown in FIG. 24J.

This invention is not limited to the above-described embodiment. It will be understood by those skilled in the art that various changes in form and detail may be made without departing from the spirit, scope, and teaching of the invention.

What is claimed is:

1. A semiconductor memory device comprising:
   a memory cell array formed on a well region of a semiconductor substrate, said memory cell array having word lines, bit lines crossing the word lines, and electrically rewritable and non-volatile memory cells disposed at the crossings between the word lines and bit lines, drain and source of each memory cell being coupled to a bit line and a source line, respectively; and
   a sense amplifier circuit connected to the bit lines for reading data of selected memory cells, wherein
   said device has such a data read mode as to detect whether cell current flows or not from a selected bit line to the source line in accordance with data of a selected memory cell under the condition of: the well region is set at a base potential; a selected word line is applied with a read voltage, which turns on or off the selected memory cell in accordance with data thereof; the source line is applied with a first positive voltage higher than the base potential; and the selected bit line is applied with a second positive voltage higher than the first positive voltage, wherein
   said memory cell array is formed of NAND cell units so arranged as to share a source line, each NAND cell unit having memory cells arranged in the direction of the bit line and connected in series, control gates of which are coupled to different word lines, respectively, a first select gate transistor for coupling one end of the NAND cell unit to a bit line, and a second select gate transistor for coupling the other end to the source line, wherein
   in the data read mode, non-selected word lines in a NAND cell unit including the selected memory cell are applied with a pass voltage, which turns on memory cells without regard to cells' data; and a non-selected bit line disposed adjacent to the selected bit line is applied with the first positive voltage, and wherein
   in the data read mode, in case the selected memory cell in the NAND cell unit is positioned in a certain region near the bit line, the source line is set at ground potential, while in case the selected memory cell is positioned outside of the certain region, the first positive voltage applied to the source line is changed to be higher as the position of the selected memory cell becomes nearer to the source line.

2. The semiconductor memory device according to claim 1, wherein
   said memory cell array is formed of NAND cell units so arranged as to share a source line, each NAND cell unit having memory cells arranged in the direction of the bit line and connected in series, control gates of which are coupled to different word lines, respectively, a first select gate transistor for coupling one end of the NAND cell unit to a bit line, and a second select gate transistor for coupling the other end to the source line, and wherein
   the device has such a data write mode as to repeat a write voltage application operation for applying a write voltage to a selected word line, thereby writing data in selected memory cells along the selected word line, and a verify-read operation for verifying the write states of the selected memory cells, and wherein
   in the verify-read operation in the data write mode, the well region is applied with a base potential; the selected word line is applied with a verify-read voltage, which turns on or off the selected memory cells in accordance with data thereof; non-selected word lines in the NAND cell unit including the selected word line are applied with a pass voltage, which turns on memory cells without regard to cells' data; the source line is applied with a positive voltage higher than the base potential; and a selected bit line is applied with a second positive voltage higher than the first positive voltage.

3. The semiconductor memory device according to claim 1, wherein
   each memory cell has a stacked gate transistor structure with a gate length of 100 nm or less.

4. A semiconductor memory device comprising a memory cell array formed on a well region of a semiconductor substrate, each memory cell within said memory cell array storing one of two or more threshold voltage distributions as data in a non-volatile manner, wherein
   said device has such a data read mode as to detect whether cell current flows or not in a selected memory cell on condition that a reverse bias voltage is applied between source of the selected memory cell and the well region for lessening an inhibited range between the threshold voltage distributions, wherein
   said memory cell array having word lines, bit lines crossing the word lines, and electrically rewritable and non-volatile memory cells disposed at the crossings between the word lines and bit lines, drain and source of each memory cell being coupled to the bit line and a source line, respectively, wherein
   the data read mode is performed by detecting whether cell current flows or not from a selected bit line to the source line in accordance with data of a selected memory cell under the condition of: the well region is set at a base potential; a selected word line is applied with a read voltage, which turns on or off the selected memory cell in accordance with data thereof; the source line is applied with a first positive voltage higher than the base potential; and the selected bit line is applied with a second positive voltage higher than the first positive voltage, wherein said memory cell array is formed of NAND cell units so arranged as to share a source line, each NAND cell unit having memory cells arranged in the direction of the bit line and connected in series, control gates of which are coupled to different word lines, respectively, a first select gate transistor for coupling one end of the NAND cell unit to a bit line, and a second select gate transistor for coupling the other end to the source line, wherein in the data read mode, non-selected word lines in a NAND cell unit including the selected memory cell are applied with a pass voltage, which turns on memory cells without regard to cells' data; and a non-selected bit line disposed adjacent to the selected bit line is applied with the first positive voltage, and wherein in the data read mode, in case the selected memory cell in the NAND cell unit is positioned in a certain region near the bit line, the source line is set at ground potential, while in case the selected memory cell is positioned outside of the certain region, the first positive voltage applied to the source line is changed to be higher as the position of the selected memory cell becomes nearer to the source line.

5. The semiconductor memory device according to claim 4, further comprising:

a sense amplifier circuit connected to the bit lines for reading data of selected memory cells, wherein after having precharged the selected bit line to the second positive voltage, the sense amplifier circuit detects whether the selected bit line is discharged or not via the selected memory cell in the data read mode.

6. The semiconductor memory device according to claim 4, wherein said memory cell array is formed of NAND cell units so arranged as to share a source line, each NAND cell unit having memory cells arranged in the direction of the bit line and connected in series, control gates of which are coupled to different word lines, respectively, a first select gate transistor for coupling one end of the NAND cell unit to a bit line, and a second select gate transistor for coupling the other end to the source line, and wherein the device has such a data write mode as to repeat a write voltage application operation for applying a write voltage to the selected word line, thereby writing data in selected memory cells along the selected word line, and a verify-read operation for verifying the write state of the selected memory cells, and wherein the verify-read operation in the data write mode is performed under the condition of: the well region is applied with a base potential; the selected word line is applied with a verify-read voltage, which turns on or off the selected memory cells in accordance with data thereof; non-selected word lines in the NAND cell unit including the selected word line are applied with a pass voltage, which turns on memory cells without regard to cells' data; the source line is applied with a positive voltage higher than the base potential; and a selected bit line is applied with a second positive voltage higher than the first positive voltage.

7. The semiconductor memory device according to claim 4, wherein each memory cell has a stacked gate transistor structure with a gate length of 100 nm or less.

8. A semiconductor memory device comprising:

a device base including a semiconductor substrate and a semiconductor layer formed with an insulator film interposed therebetween;

a memory cell array having electrically rewritable and non-volatile memory cells formed on the semiconductor layer of the device base; and a sense amplifier circuit coupled to a bit line of the memory cell array for detecting whether cell current flows or not from the bit line to a source line via a selected memory cell, thereby reading out data, wherein at a data read time, the source line is applied with a first positive voltage; and the bit line is applied with a second positive voltage higher than the first positive voltage, wherein said memory cell array is formed of NAND cell units so arranged as to share a source line, each NAND cell unit having memory cells arranged in the direction of the bit line and connected in series, control gates of which are coupled to different word lines, respectively, a first select gate transistor for coupling one end of the NAND cell unit to a bit line, and a second select gate transistor for coupling the other end to the source line, wherein in the data read mode, non-selected word lines in a NAND cell unit including the selected memory cell are applied with a pass voltage, which turns on memory cells without regard to cells' data; and a non-selected bit line disposed adjacent to the selected bit line is applied with the first positive voltage, and wherein in the data read mode, in case the selected memory cell in the NAND cell unit is positioned in a certain region near the bit line, the source line is set at ground potential, while in case the selected memory cell is positioned outside of the certain region, the first positive voltage applied to the source line is changed to be higher as the position of the selected memory cell becomes nearer to the source line.

9. The semiconductor memory device according to claim 8, wherein each NAND cell unit has plural memory cells connected in series and select gate transistors for coupling both ends thereof to a bit line and a source line, respectively.

10. The semiconductor memory device according to claim 8, wherein the device has such a data write mode as to repeat a write voltage application operation for applying a write voltage to a selected word line, thereby writing data in selected memory cells along the selected word line, and a verify-read operation for verifying the write states of the selected memory cells, and wherein in the verify-read operation in the data write mode, the well region is applied with a base potential; the selected word line is applied with a verify-read voltage, which turns on or off the selected memory cells in accordance with data thereof non-selected word lines in the NAND cell unit including the selected word line are applied with a pass voltage, which turns on memory cells without regard to cells' data; the source line is applied with a positive voltage higher than the base potential; and a selected bit line is applied with a second positive voltage higher than the first positive voltage.

11. The semiconductor memory device according to claim 8, wherein each memory cell has a stacked gate transistor structure with a gate length of 100 nm or less.

* * * * *